US006959092B1

(12) United States Patent
Berkhoff et al.

(10) Patent No.: US 6,959,092 B1
(45) Date of Patent: Oct. 25, 2005

(54) NOISE REDUCTION PANEL ARRANGEMENT AND METHOD OF CALIBRATING SUCH A PANEL ARRANGEMENT

(75) Inventors: Arthur Perry Berkhoff, The Hague (NL); Michiel Wilbert Rombout Maria Van Overbeek, Dordrecht (NL); Nicolaas Jan Doelman, Delft (NL)

(73) Assignee: Nederlandse Organisatie voor Toegepast-Natuurwetenschappelijk Onderzoek TNO, Delft (NL)

( * ) Notice: Subject to any disclaimer, the term of this patent is extended or adjusted under 35 U.S.C. 154(b) by 0 days.

(21) Appl. No.: 09/830,966

(22) PCT Filed: Oct. 28, 1999

(86) PCT No.: PCT/NL99/00664

§ 371 (c)(1),
(2), (4) Date: Aug. 1, 2001

(87) PCT Pub. No.: WO00/26900

PCT Pub. Date: May 11, 2000

(30) Foreign Application Priority Data

Nov. 3, 1998 (EP) .................................. 98203699

(51) Int. Cl.[7] ................................................ H03B 29/00

(52) U.S. Cl. ............... 381/71.1; 381/71.11; 381/71.12; 381/94.1

(58) Field of Search ............................ 381/71.1–71.14, 381/94.1

(56) References Cited

U.S. PATENT DOCUMENTS 4,025,724 A * 5/1977 Davidson et al. .......... 381/71.2
4,815,139 A * 3/1989 Eriksson et al. ......... 381/71.11
5,315,661 A * 5/1994 Gossman et al. .......... 381/71.1
5,347,586 A * 9/1994 Hill et al. .................. 381/71.8
5,416,845 A 5/1995 Qun
5,526,432 A * 6/1996 Denenberg ............... 381/71.14
5,748,750 A * 5/1998 L'Esperance et al. ...... 381/71.5
6,192,133 B1 * 2/2001 Enamito et al. ........... 381/71.5

FOREIGN PATENT DOCUMENTS

GB 2 310 512 8/1997

OTHER PUBLICATIONS

J. Guo et al., "Actively Created Quiet Zones by Multiple Control Sources in Free Space", Journal of the Acoustical Society of America, vol. 101, No. 3, Mar. 1997, pp1492-1501.

(Continued)

*Primary Examiner*—Sinh Tran
*Assistant Examiner*—Corey Chau
(74) *Attorney, Agent, or Firm*—Young & Thompson

(57) ABSTRACT

Noise reduction arrangement including: a plurality of actuators (3(*n*)) for generating secondary noise ($p_s$) to reduce primary noise ($p_p$) and being located in a first surface; a plurality of errors sensors (2(*m*)) located in a second surface parallel to the first surface for sensing a total amount of noise resulting from the primary noise after being reduced by the secondary noise; a plurality of control elements (5(*i*)) for controlling the actuators (3(*n*)) based on the sensor outputs, wherein the distance (d) between the first and second surfaces is such that reduction in power RP of the total amount of noise relative to the primary noise within a predetermined frequency band is within the following range: $0.9\times RP_{max} \leqq RP \leqq RP_{max}$ in which $RP_{max}$ is the maximum obtainable reduction in power of the total amount of noise relative to the primary noise, both RP and $RP_{max}$ being expressed in decibel.

6 Claims, 12 Drawing Sheets

OTHER PUBLICATIONS

J. Elliott Stephen et al., "Interaction between multiple feed-forward active control systems", IEEE Trans Speech Audio Process, vol. 2, No. 4, Oct. 1994, pp521-530.

B. Wang, "Optimal Placement of Microphones and Piezoelectric Transducer Actuators for Far-Field Sound Radiation Control", Journal of the Acoustical Society of America, vol. 99, No. 5, May 1996, pp2975-2984.

* cited by examiner

NOISE REDUCTION PANEL ARRANGEMENT AND METHOD OF CALIBRATING SUCH A PANEL ARRANGEMENT

FIELD OF THE INVENTION

The present invention relates to a noise reduction arrangement comprising:

- a plurality of actuators for generating secondary noise to reduce primary noise generated by at least one primary source;
- a plurality of sensors for sensing the total amount of noise resulting from the primary noise after being reduced by the secondary noise and for generating a plurality of sensor signals;
- control means for controlling the actuators based on the sensor signals, the distance between the plurality of actuators and the plurality of sensors being first and second surfaces is selected to have an optimised reduction in power RP of the total amount of noise relative to the primary noise within a predetermined frequency band.

BACKGROUND OF THE INVENTION

Such a noise reduction arrangement is known from J. Guo, e.a, "Actively created quiet zones by multiple control sources in free space", J. Acoust. Soc. Am. 101 (3), March 1997, pp. 1492–1501. This document discloses an arrangement with a series of secondary sources on a first line and a series of error sensors on a second line, the first and second lines being parallel. The primary concern of this document is to create large areas of quiet zones. The document observes that such a requirement can be satisfied if the error sensors are not in the near field of the secondary sources. According to the document, the distance between the second line with the error sensors and the first line with the secondary sources should be greater than or comparable to the mutual distances between the secondary sources. Guo e.a. only present a model for this two line arrangement. Moreover, in their model, all secondary sources are controlled by the output signals of all error sensors. Implementing such a control arrangement results in a complex controller with many connections and which turns out to be rather slow in many applications.

S. J. Elliott et al., Interaction Between Multiple Feedforward Active Control Systems, IEEE Transactions on Speech and Audio Processing, Vol. 2, No. 4, 1994, pp. 521–530 [1] describe a noise reduction system having a panel of actuators arranged in a first plane and a plurality of error sensors in a second plane. The first and second planes are parallel to one another. Elliott et al. present a mathematical model of a decentralised adaptive feedforward control system. They also present results of some physical examples in which there are two actuators and two error sensors. In these examples, Elliott et al. introduce the mutual distances between the error sensors and the actuators as important parameters to derive conditions as to when such a system is stable. In the physical examples given, the distance between the two planes is about 0.3 times the distance between the two actuators. Elliott et al. do not disclose the presence of an optimum distance between the two planes as a function of the mutual distance between actuators.

X. Qui, e.a, A Comparison of Near-field Acoustic Error Sensing Strategies for the Active Control of Harmonic Free Field Sound Radiation, Journal of Sound and Vibration, 1998, 215(1), pp. 81–103 [2], disclose the results of a study to find the best location of an error sensor relative to a primary noise source. However, this study is limited to a harmonic sound field radiated by a monopole primary source and by a dipole-like pair of primary sources. In both cases the actuator is a monopole radiating at the same frequency as the primary source. No plurality of actuators and plurality of error sensors arranged in respective planes are disclosed.

An active high transmission loss panel is disclosed in WO-A-94/05005. However, in this patent document the actuators and sensors are all located in the same plane.

BRIEF SUMMARY OF THE INVENTION

The present invention is directed to a noise reduction arrangement having a plurality of actuators in a first surface and a plurality of error sensors in a second surface in which the reduction of noise is optimised as a function of the distance between the surfaces and in which the control means are simplified. The surfaces may be planes, like in the arrangement of Elliott et al. [1], but they may also deviate from planes. They may, e.g., be slightly curved.

Thus, the noise reduction arrangement as defined above is characterised in that

- the plurality of actuators are located in a first two dimensional array in a first surface;
- the plurality of sensors are located in a second two dimensional array in a second surface arranged substantially parallel to the first surface;
- the plurality of actuators are sub-divided into a plurality of subsets of actuators;
- the control means comprise a plurality of controllers, each controller being arranged to receive sensor signals of a sub-set of said plurality of sensors and arranged to control one single subset of actuators; and
- said first and second surfaces are arrange at such a mutual distance that the reduction of power RP is within the following range:

$$0.9\times RP_{max} \leqq RP \leqq RP_{max}$$

in which $RP_{max}$ is maximum obtainable reduction in power of the total amount of noise relative to the primary noise at an optimum distance between said first and second surfaces as established by testing, where both RP and $RP_{max}$ are expressed in decibel, wherein the plurality of actuators are arranged in rows and columns, mutual distances between adjacent columns and mutal distances between adjacent rows being equal to a predetermined actuator distance $d_x$, the plurality of sensors being arranged in the same way as the plurality of actuators, the distance d between the first and the second surfaces meeting the following condition:

$$0.5\times d_x \leqq d \leqq d_x$$

The present invention is based on the insight that a maximum reduction shows up in the curve representing the reduction of the total amount of sound power relative to the primary noise as a function of the distance between the surfaces and that it is not necessary to have each actuator controlled by the output signals of each of the sensors. The actual optimum distance where the maximum occurs depends on several parameters, like the number of actuators, the number of sensors, the ratio between these two numbers, the actual arrangement of the actuators and the actual arrangement of the sensors. The optimum distance can be established by testing while increasing the distance between the surfaces from 0, while adjusting a predetermined control parameter (β) to maintain stability.

Preferably, each controller is arranged to receive sensor signals of only those sensors which are within a predetermined range from said controller.

In one of the arrangements, the number of sensors equals the number of actuators and equals the number of controllers, each controller receiving one of the plurality of sensor signals as input signal and controlling one of the plurality of the actuators. When, in such an arrangement, the plurality of actuators are arranged in rows and columns, mutual distances between adjacent columns and mutual distances between adjacent rows are equal to a predetermined actuator distance $d_x$ and the plurality of sensors are arranged in the same way as the plurality of actuators, the distance d between the first and the second surfaces preferably meets the following condition:

$$0.5\times d_x \leqq d \leqq d_x.$$

In one embodiment, the arrangement includes a supervising controller for monitoring long-term behaviour of the arrangement and for modifying control parameters of the controllers in order to ensure overall stability of the arrangement.

BRIEF DESCRIPTION OF THE DRAWINGS

Hereinafter, the invention will be explained with reference to some drawings. The drawings and explanation are only given by way of example and are not intended to limit the scope of the present invention.

DETAILED DESCRIPTION OF THE INVENTION

The description hereinafter presents simulation results of multiple local control systems intended for the active minimization of sound transmitted through a plate. The systems are analyzed for harmonic disturbances with respect to stability, convergence, reduction of transmitted sound power, the distance between actuators and sensors, and sensitivity for reverberating environments. The local control systems are compared with global control systems. Global control systems are those systems in which each of the actuators are controlled in dependence on each of the sensor output signals, whereas local control systems are those systems in which one or more of the actuators are controlled by one or more but not all of the sensor output signals.

Figure 1A:
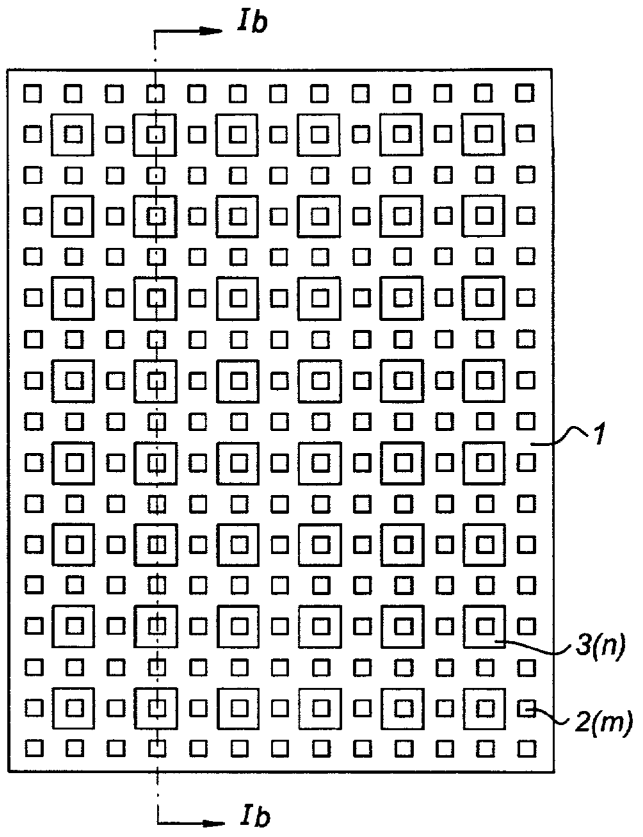
FIG. 1*a* shows a front view of a plate provided with 48 actuators and 221 sensors in front of the plate.

FIG. 1*a* shows a baffled plate 1, which supports a plurality of actuators 3(*n*), n=1, . . . , N. In FIG. 1*a* 48 actuators 3(*n*) are shown. However, if required any other number of actuators 3(*n*) may be applied.

Supported by suitable supporting means (not shown), a plurality of sensors 2(*m*), m=1, . . . , M, is arranged in front of the plate 1. In FIG. 1*a*, 221 sensors 2(*m*) are shown. FIG. 1*a* shows a local control system: each actuator 3(*n*) is associated with 9 sensors 2(*m*), adjacent actuators 3(*n*) sharing three of the sensors 2(*m*). Of course, any other number than 221 sensors 2(*m*) may be applied and the actuators may be controlled by other numbers of sensors.

In FIG. 1*a*, the actuators 3(*n*) and the sensors 2(*m*) are regularly arranged in columns and rows at equal distances. However, this is not necessary.

Figure 1B:
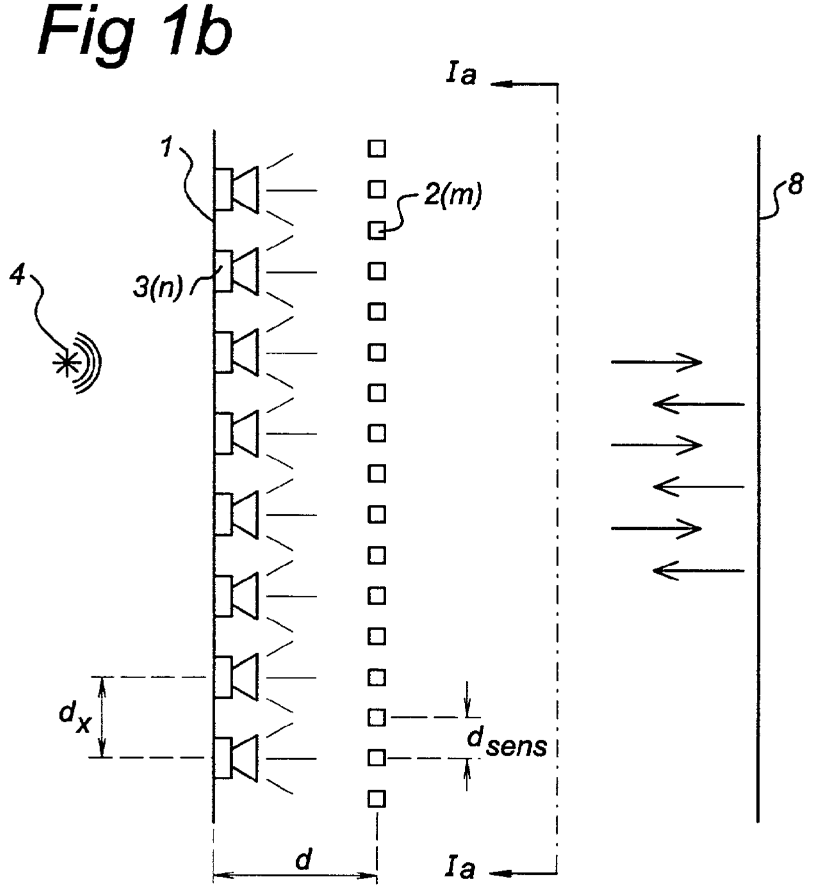
FIG. 1*b* shows a schematic cross section view of the arrangement according to FIG. 1*a* along line IB—IB in FIG. 1*a;*

FIG. 1*b* shows a cross section through the arrangement according to FIG. 1*a* along line IB—IB. The same reference numbers refer to the same elements.

The acoustic radiation of primary noise source 4 causes a pressure field $p_{inc}$ incident on plate 1.

The mutual distance between two adjacent actuators is $d_x$. The mutual distance between two adjacent sensors 2(*m*) is $d_{sens}$. The distance between the actuator plane and the sensor plane is d.

Also shown is a reflective wall 8 which might be present in some embodiments, as will be explained below.

The actuators 3(*n*) are shown to be loudspeakers producing secondary noise $p_s$ in order to reduce the primary noise $p_p$. The total amount of resulting noise is measured by the sensors 2(*m*) which, preferably, are microphones or other pressure-sensitive devices.

Figure 1C:
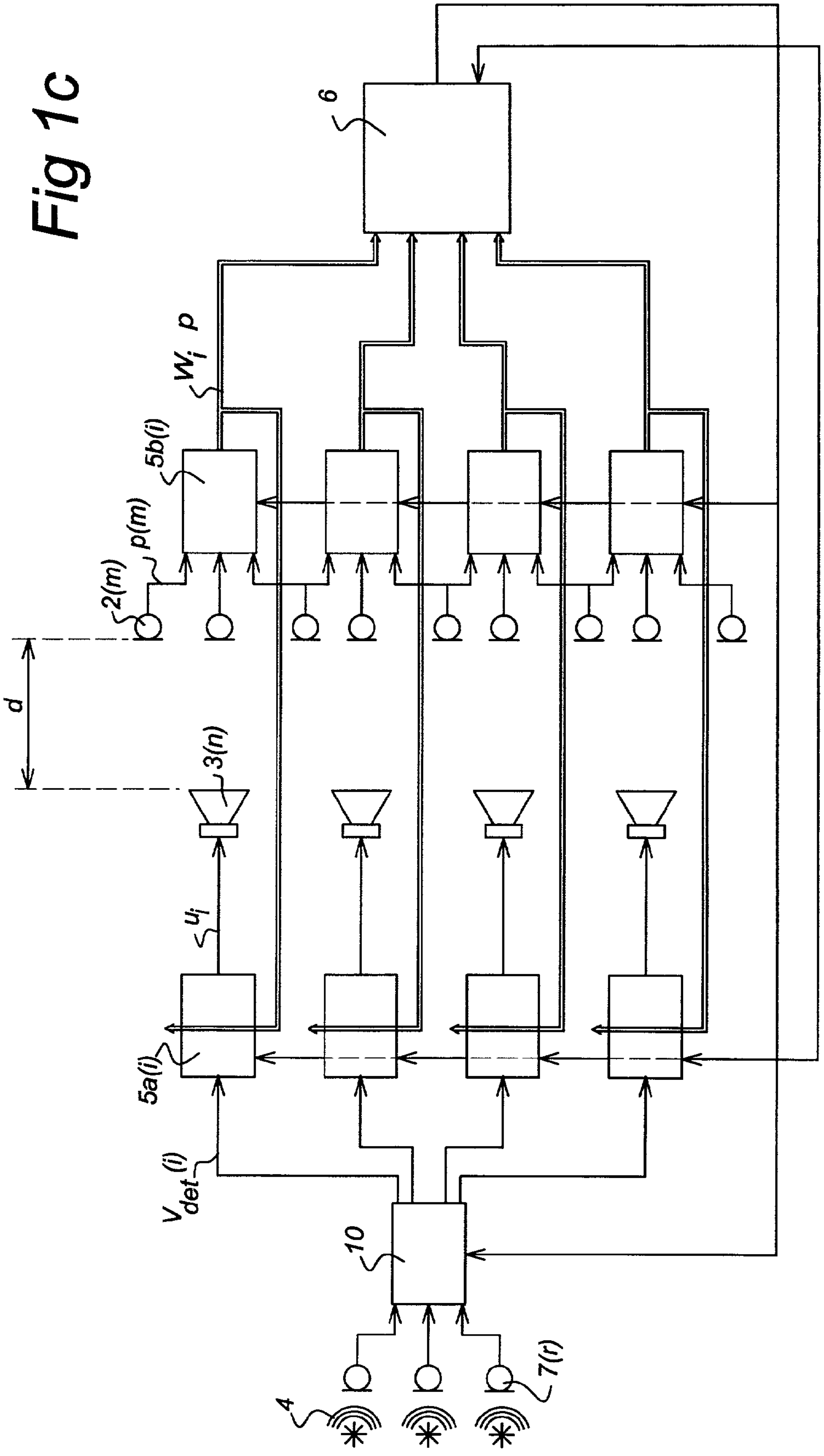
FIG. 1*c* shows a schematic electronic black box circuitry for controlling the actuators based on the sensor signals generated by the sensors.

FIG. 1*c* shows a schematic electric diagram of the arrangement used in the invention. The same reference numbers refer to the same components as in FIGS. 1*a* and 1*b*.

The sensors 2(*m*) produce sensor signals p(m) which are transferred to one or more controllers 5*b*(i), i=1, 2, . . . , 1, e.g., in the way shown in FIG. 1*c*.

FIG. 1*c* shows four controllers 5*b*(i), but there may be any other desired number. They provide one or more output signals $W_i p$ which are transmitted to controllers 5*a*(i) of a further set of controllers which directly control the actuators 3(*n*). The outputs $W_i p$ of the controllers 5*b*(i) are also input to a supervising controller 6.

In some embodiments use of one or more detection sensors 7(*r*), r=1, . . . , R, may be preferred. These detection sensors provide time-advanced information of the primary noise $p_p$ to a distribution network 10. The distribution network 10 produces detection signals $v_{det}(i)$ for the controllers 5*a*(i). Both the distribution network 10 and the controllers 5*a*(i) and 5*b*(i) may be controlled by the supervising controller 6.

Each of the controllers 5*a*(i) controls one or more of the actuators 3(*n*) by means of control signals $u_i$.

The supervising controller 6 may be used for monitoring long-term behaviour of the system and for modifying control parameters of the distribution network 10 and the controllers 5*a*(i), 5*b*(i) in order to ensure overall stability of the system.

It is noted that distribution network 10, controllers 5*a*(i), 5*b*(i), and supervising controller 6 are shown to be separate units, however, in reality they may be implemented by a single control unit performing all required functions. Controllers 5*a*(i), 5*b*(i) and 6 are preferably software driven computer units. However, optionally they may be implemented using digital circuits. Moreover, they need not be physically separated. They may be implemented as different functional sections of one single processor. On the other hand, some of the functionality of their functions may be implemented on remote processors if required. For the case of simplicity, in the description and the claims reference will only be made to processors 5*a*(i), 5*b*(i), and 6.

Although FIG. 1*c* shows a situation in which each controller 5*a*(i) controls one actuator 3(*n*), in the theoretical analysis given below, it will be assumed that each controller 5*a*(i) controls K actuators 3(*n*).

Analysis

It is assumed that each of the controllers 5*a*(i), 5*b*(i) tries to minimize a cost function based on sensor signals local to that controller. The scalar cost functions $J_i$ for the I controllers 5*a*(i) are written as $$J_i=(W_i p)^H(W_i p)+u_i^H \beta_i u_i,\ i=1, \ldots I, \tag{1}$$

in which p is an M×1 vector of sensor signals, $W_i$ is a weighting matrix of dimensions P×M which provides a selection and weighting of P out of a total of M sensor signals used as error inputs for controller 5*a*(i); $u_i$ is a K×1-dimensional control signal for node i and $\beta_i$ is a K×K dimensional effort weighting matrix. The sensor signals p result from the superposition of primary field contributions $p_p$ and the contributions $p_s$ due to N actuators. The latter contributions are given by Gu, where u is an N×1 vector denoting the control signals that drive the actuators and G is an M×N matrix of transfer functions between control signals and sensor signals. Hence, $$p=p_p+Gu \tag{2}$$

Each controller 5*a*(i) drives K actuators, so N=IK.

Introducing the M×N matrix $$\hat{G}=[F_1G_1, F_2G_2, F_1G_1] \tag{3}$$

with $F_i=W_i^H W_i$ and $G_i$ denoting the columns G corresponding to controllers 5*a*(i) having dimensions M×K and the N×N block-diagonal matrix β defined by $$\beta=\begin{bmatrix} \beta_1 & 0 & \ldots & 0 \\ 0 & \beta_2 & \ldots & 0 \\ \ldots & & & \ldots \\ 0 & 0 & \ldots & \beta_1 \end{bmatrix} \tag{4}$$

a linear system of N equations in u can be formulated:

$$(\hat{G}^H G+\beta)u=-\hat{G}^H p_p \tag{5}$$

The present result explicitly includes the weighting factors for the error sensors. To arrive at the solution for u an iterative procedure is implemented in the system, such as the procedure described by Elliott et al. [5]. For interpretation of system behaviour the reader is referred to [1].

Simulations

In this section simulation results are given for an active control system intended to reduce the noise transmitted through plate 1. The sensors 2(*m*) are pressure sensors placed in the near-field of the plate 1. In the example, the actuators 3(*n*) are loudspeakers which are assumed to operate as constant volume velocity (monopole-like) sources. The plate 1 is assumed to be a 1 mm thick aluminium plate of 60 cm×80 cm, having a modulus $7\times10^{10}$ Pa, Poisson ratio of 0.3, hysteretic damping η=0.02, and a density of $2.6\times10^3$ kg $m^{-3}$. The plate 1 is assumed to be simply supported and the incident field $p_{inc}$ is a plane wave arriving at a direction α of 60 degrees to the plate normal. The basic configuration consists of 6×8=48 actuators and 13×17=221 sensors, as shown in FIG. 1*a*.

As opposed to active global control systems which minimize a global quadratic error criterion, stability is not guaranteed in multiple local systems. Assuming an iterative procedure to solve Eq. [5], the system is stable if the real parts of the eigenvalues $\lambda_n$, n=1, . . . , N of the matrix $\hat{G}^H G+\beta$ are positive [1]. The effort weighting matrix is taken to be the diagonal matrix β=βI. If the system is unstable for β=0 the value of β will be set equal to $-\min_n \mathrm{Re}\lambda_n$, which makes the system just stable. Increasing the value of B further would enhance the stability margin and improve the speed of convergence of the iterative procedure, but also increase the residual radiated power. The convergence of some iterative procedures is governed by the ratio of the largest singular value $K_1$ to the smallest singular value $K_N$ [5], i.e. the condition number of the Hessian matrix $\hat{G}^H G+\beta$ [6].

Simulation Methods

The models describing the vibration of the plate 1 can be found in [7]. The pressure $p_p$ and $p_s$ were computed with a weak form of a Fourier-type extrapolation technique in which singularities were evaluated by analytical integration [8]. In principle, the Boundary Element method as described in [9] can also be used but the latter method is less efficient for geometries of this and larger size. Formulas for zero extrapolation distance which were used can be found in [10].

Simulation Results

Figure 2:
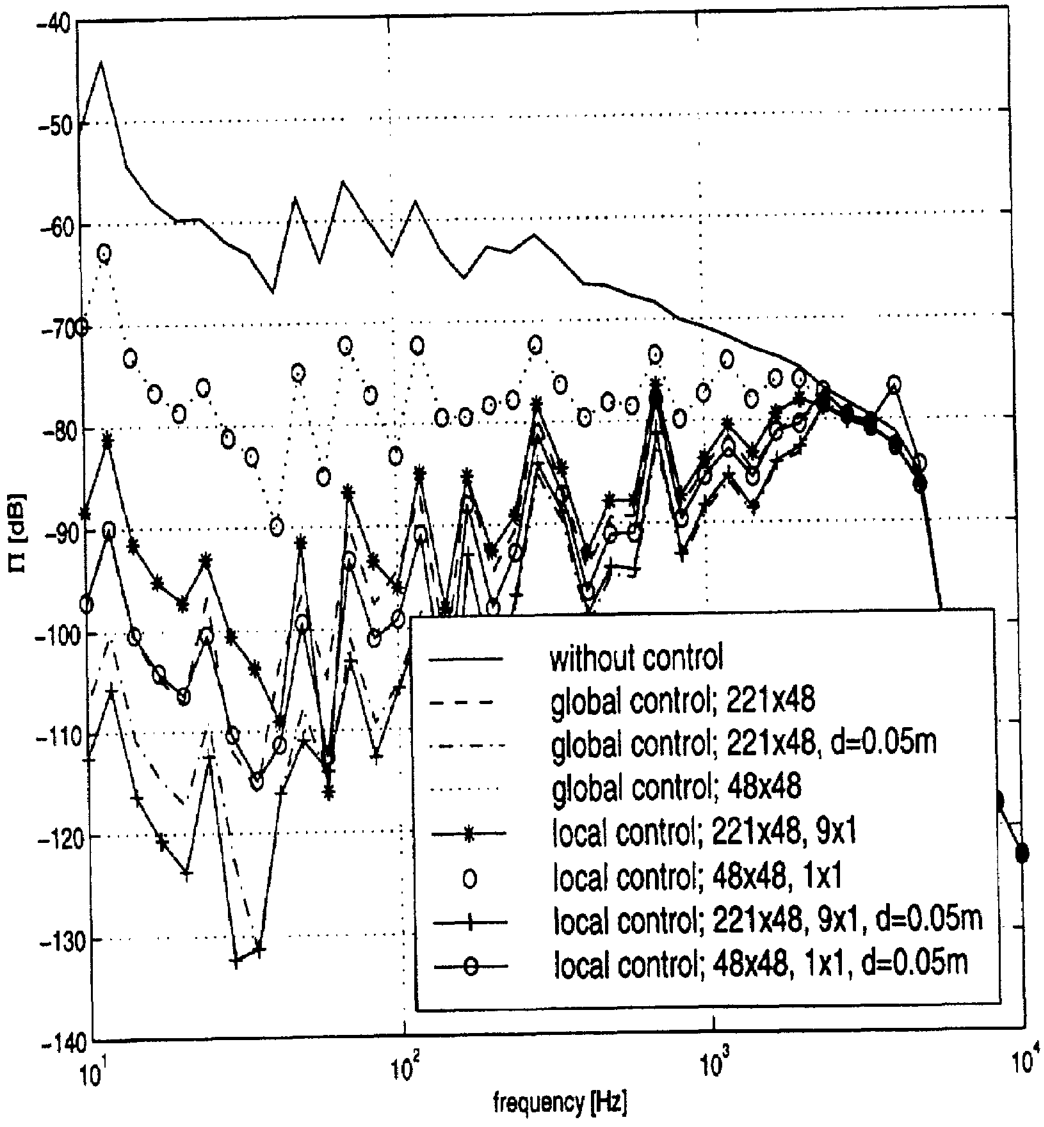
FIG. 2 shows sound power curves radiated from a plate without control, with global control and local control, respectively.

The sound power without control and with control for various configurations are shown in FIG. 2. It was found that reductions could be obtained for frequencies for which both the mutual distance $d_{sens}$ between the sensors and the mutual distance $d_x$ between the actuators were smaller than approximately half of a wavelength. Moreover, the distance d between the sensors 2(*m*) and the plate 1 turns out to be an important parameter. Larger reductions are obtained if the pressure sensors 2(*m*) are moved away from the plate 1. This distance d can not be made arbitrarily large because of stability issues. The point of instability is reached at approximately a quarter of a wavelength from the plate if the ratio $d/d_x$ is larger than a certain minimum value. If this ratio is smaller than this value, then the system is stable for all frequencies.

In FIG. 2 and the other figures, the following notations are used:

48×48: 48 sensors and 48 actuators (global control);

48×48, 1×1: 48 sensors and 48 actuators, each actuator being dependent on one sensor only;

221×48: 221 sensors and 48 actuators (global control);

221×48, 9×1: 221 sensors and 48 actuators; each actuator being dependent on 9 sensors.

A large distance d might be detrimental for primary signals with short correlation lengths. For that purpose it may be useful to add one or more detection sensors 7(*r*) in the near-field of the plate.

Figure 3:
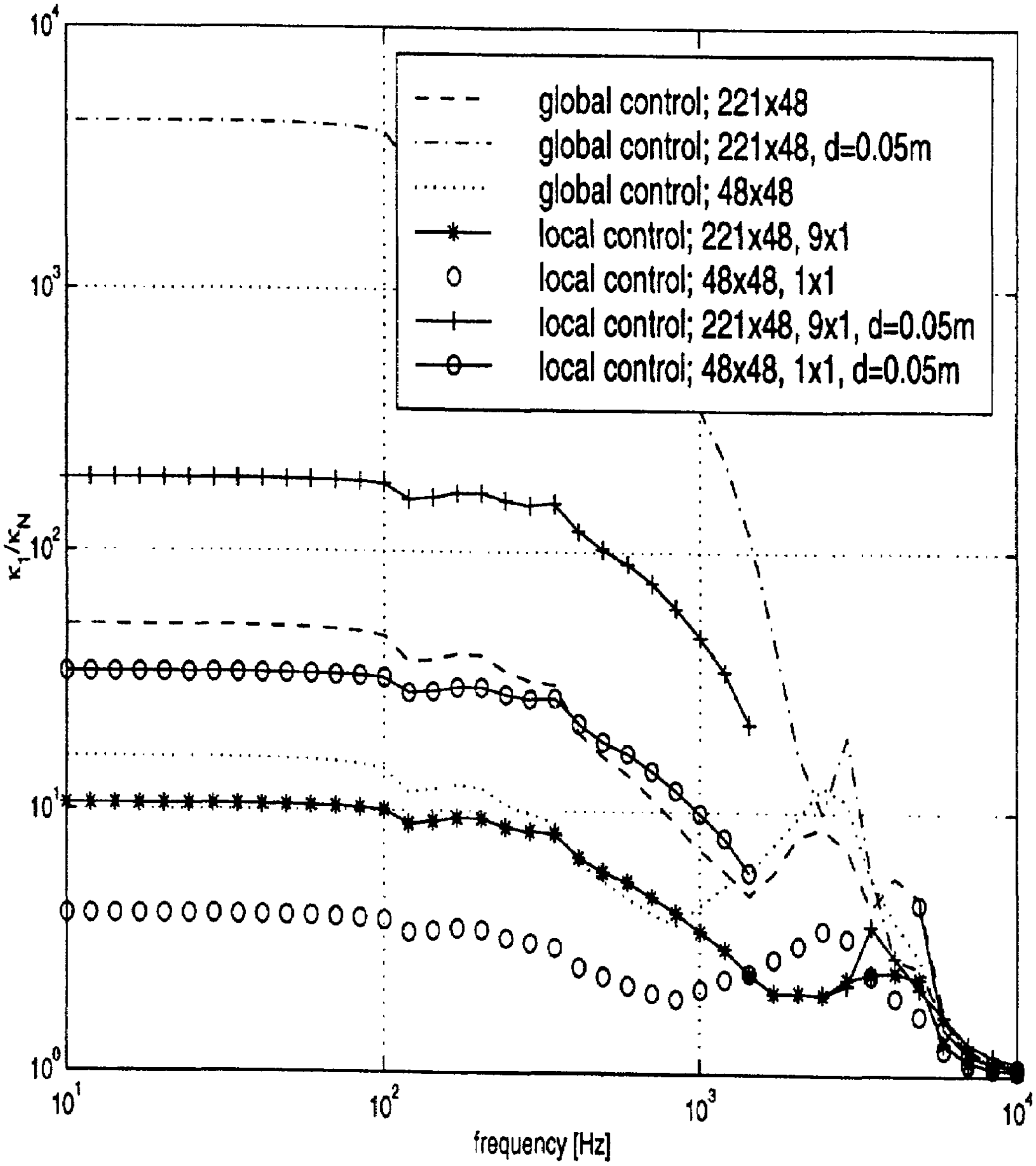
FIG. 3 shows condition numbers for the curves shown in FIG. 2.

The corresponding condition numbers are shown in FIG. 3. If a positive value of was used to make the system stable then the condition number is not shown.

Influence of d on the Reduction

From the previous results it was found that the distance d between actuator plane and the sensor plane has a considerable influence on the achievable reduction of radiated sound power. It was also found that the distance d determines the frequency above which the system has to be stabilized by increasing the value of β. A higher value of β leads to smaller reductions. The distance for instability is reached at approximately a quarter of a wavelength.

Figure 4:
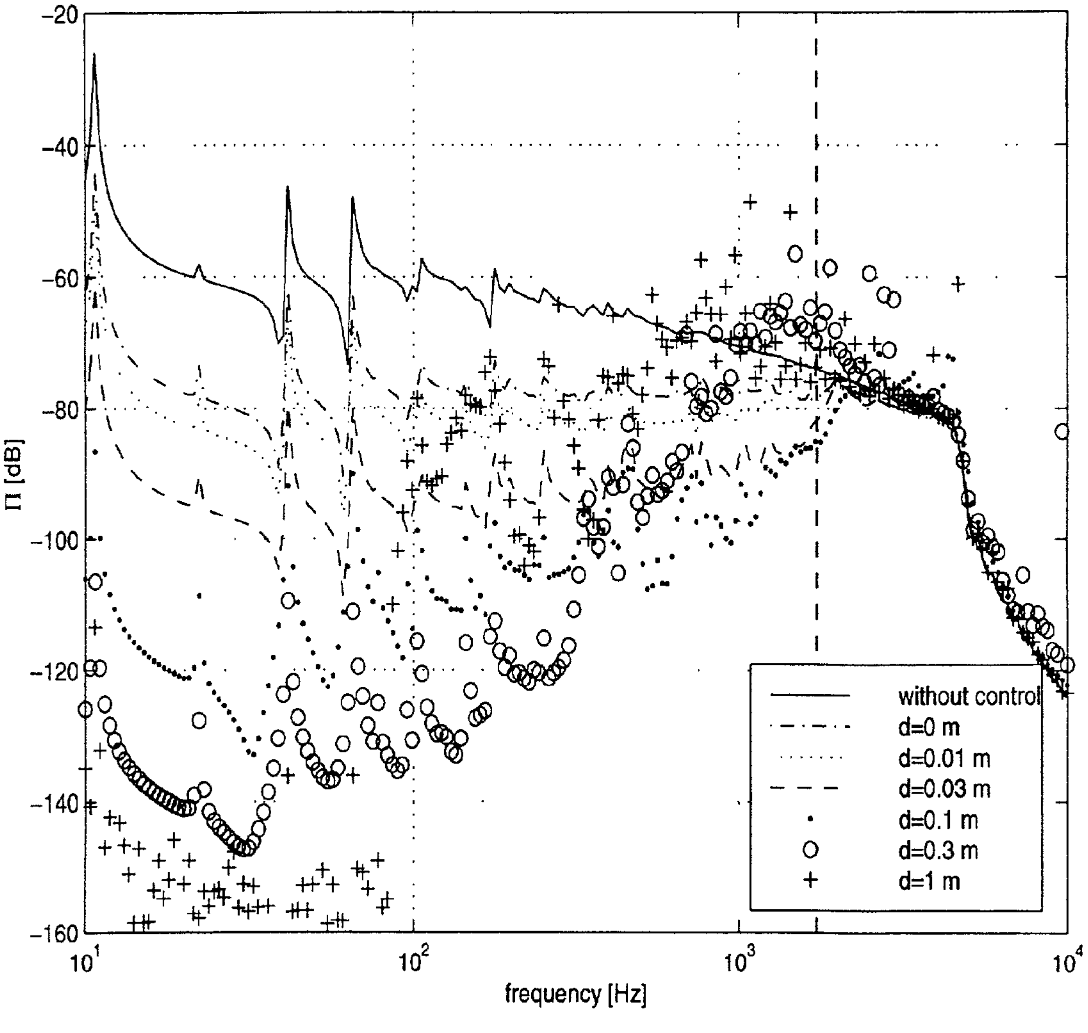
FIG. 4 shows sound power curves as a function of frequency for an arrangement with 48 actuators and 48 sensors, the distance d between the actuator plane and the sensor plane being a parameter.

Clearly, two contradicting requirements for d have to be satisfied for broadband reductions. This is illustrated in FIG. 4, which shows sound power radiated from plate 1 without control and with local control using a 48×48, 1×1 system, i.e., using a total of 48 sensors and 48 actuators, 1 sensor and 1 actuator for each independent controller, with the distance d between the actuator plane and the sensor plane as parameter. If, at any frequency, the system is unstable a positive value for β is used which makes the system just stable. If the system is stable β=0 is used. It can be seen that, for small d, reductions are increased by increasing d, particularly at low frequencies. However, the system has to be stabilized above the frequency where d equals a quarter of a wavelength. This stabilization leads to smaller reductions at high frequencies.

Figure 5:
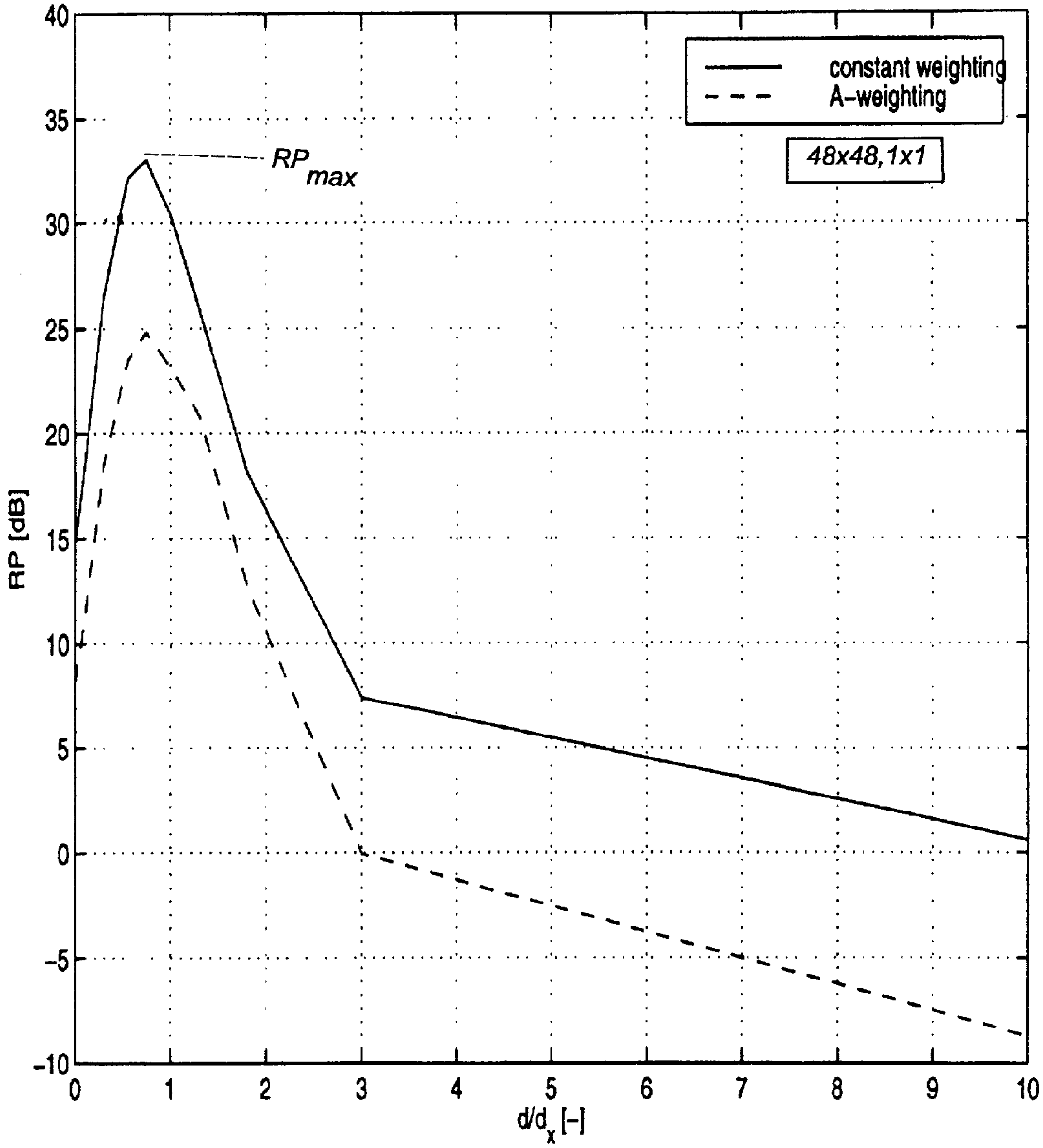
FIG. 5 shows curves of broadband reduction in sound power for the arrangement of FIG. 4 taking into account all frequencies $f<c/2d_x$, with c the speed of sound in air and $d_x$ the distance between adjacent actuators.

Hence, for broadband applications there might be an optimum value for d if the objective is to minimize the total acoustic power within a wide frequency range. It is assumed that all frequencies are taken into account for which half of the wavelength is larger than the actuator spacing $d_x$. For the present configuration, this corresponds to all frequencies smaller than $f<c/2.d_x=1715$ Hz. The latter frequency is indicated by a dashed line in FIG. 4. This frequency is the maximum frequency for which an active control system using a global error criterion leads to significant reductions of radiated sound power. For the present 1×1 system, the sensor spacing is identical to the actuator spacing. The broadband reductions for various values of d normalized to actuator spacing $d_x$ are shown in FIG. 5. Indeed, it can be seen that there is a maximum in the reduction of broadband radiated sound power, both for constant weighting and for A-weighting. The maximum reduction is obtained for $d_x/2 \leqq d \leqq d_x$.

Additional factors might influence the optimum for d. In the case of stochastic disturbances and no reference sensor 7 in a feedforward link, the delay between the actuator and the sensor should be small compared to a characteristic correlation length of the disturbance signal. In addition, for smaller d, the condition number $K_1/K_N$ of the system is lower, and often, therefore, the convergence of adaptive schemes better. These two considerations can lead to an optimum for d which is somewhat smaller than given by FIG. 5. Then, for most systems occurring in practice, the optimum for d is in the range $0.1d_x<d<d_x$.

Figure 6:
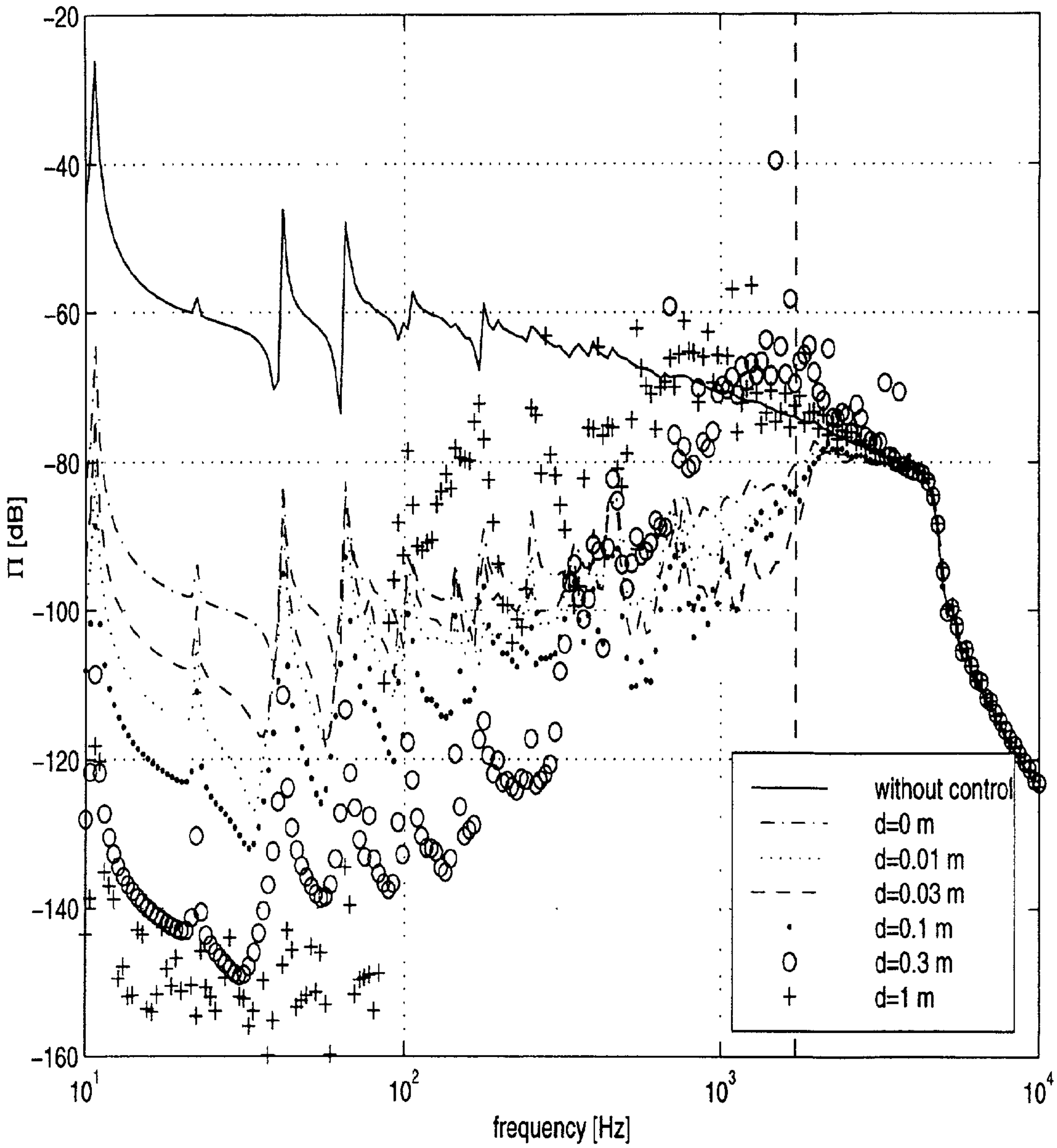
FIG. 6 shows sound power curves as a function of frequency for an arrangement with 48 actuators and 221 sensors, the distance d between the actuator plane and the sensor plane being a parameter.
Figure 7:
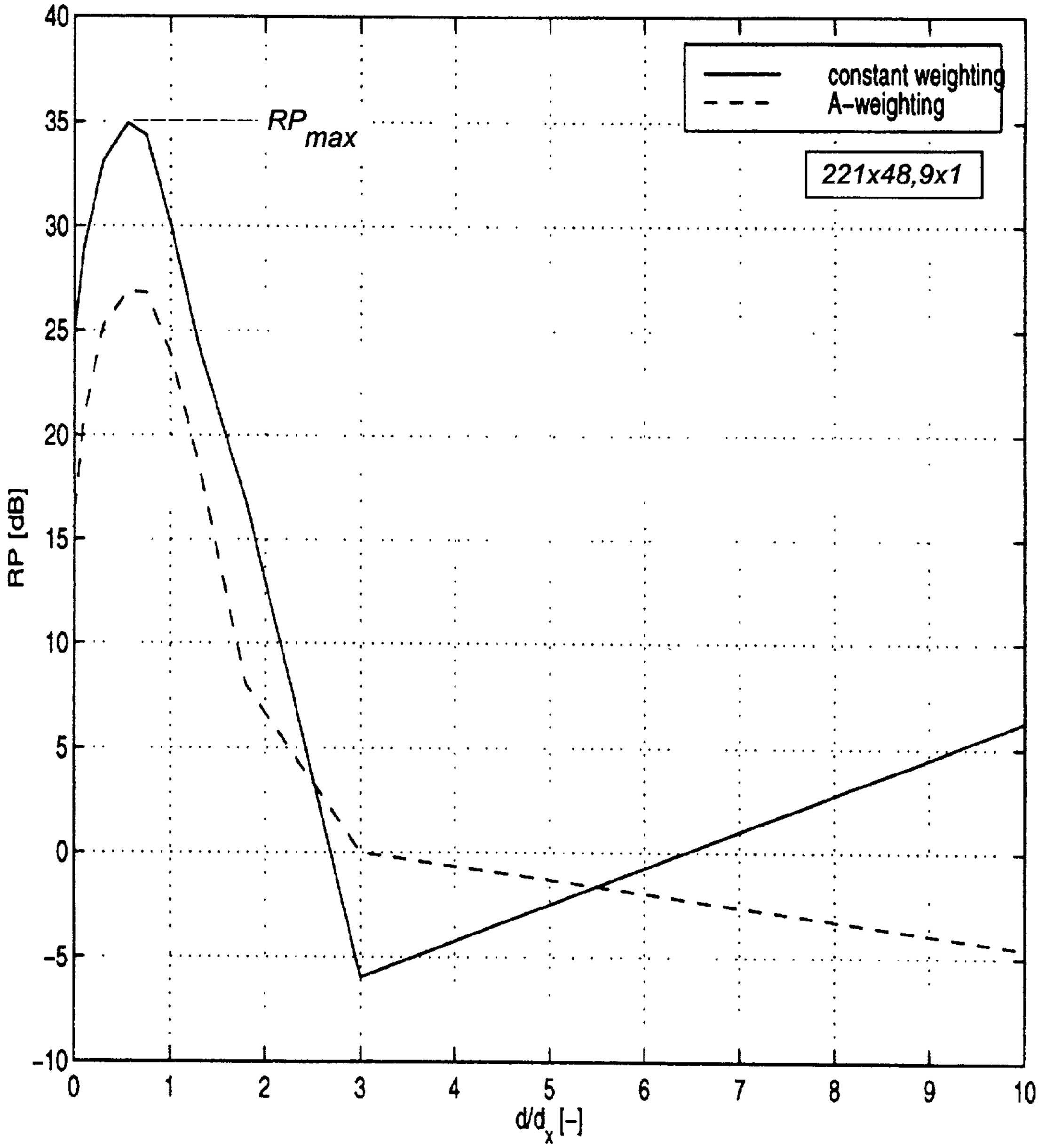
FIG. 7 shows curves of broadband reduction in sound power for the arrangement of FIG. 6, taking into account all frequencies $f<c/2d_x$.

The results for a 221×48, 9×1 system, having half the distance between the sensors, are shown in FIGS. 6 and 7. FIG. 6 shows the sound power radiated from a plate in such a system, whereas FIG. 7 shows the broadband reduction, again for all frequencies $f<c/2.d_x$. It can be seen that the maximum reduction which can be obtained is similar. The optimum value for d, as obtained from FIG. 7, is also within the range $d_x/2 \leqq d \leqq d_x$, although the peak in the reduction is wider than in FIG. 5. In practice therefore, the value of d for the 9×1 system will often be chosen somewhat smaller than for the 1×1 system.

Figure 8:
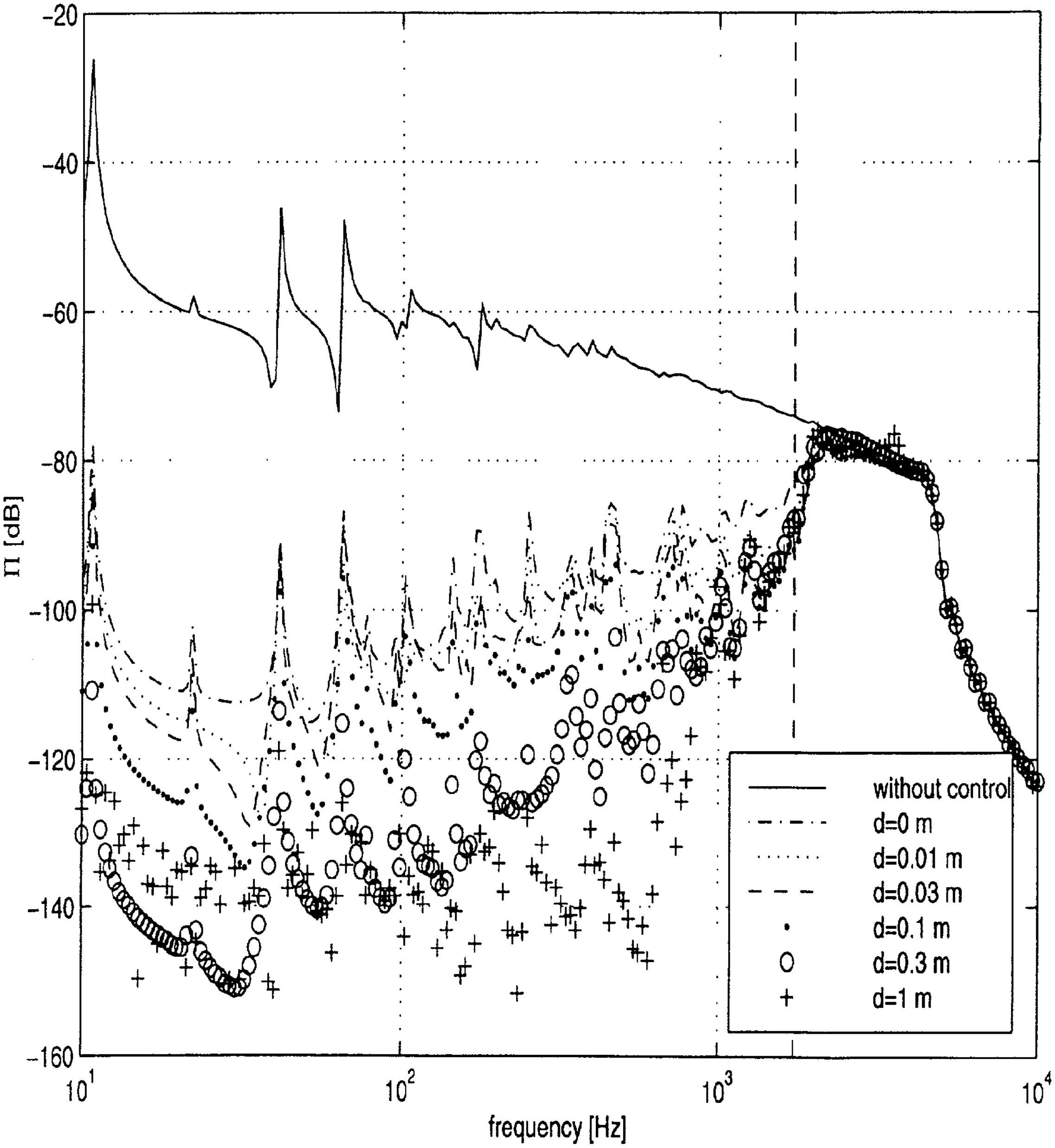
FIG. 8 shows sound power curves as a function of frequency for a global control arrangement with 48 actuators and 221 sensors, the distance d between the actuator plane and the sensor plane being a parameter.
Figure 9:
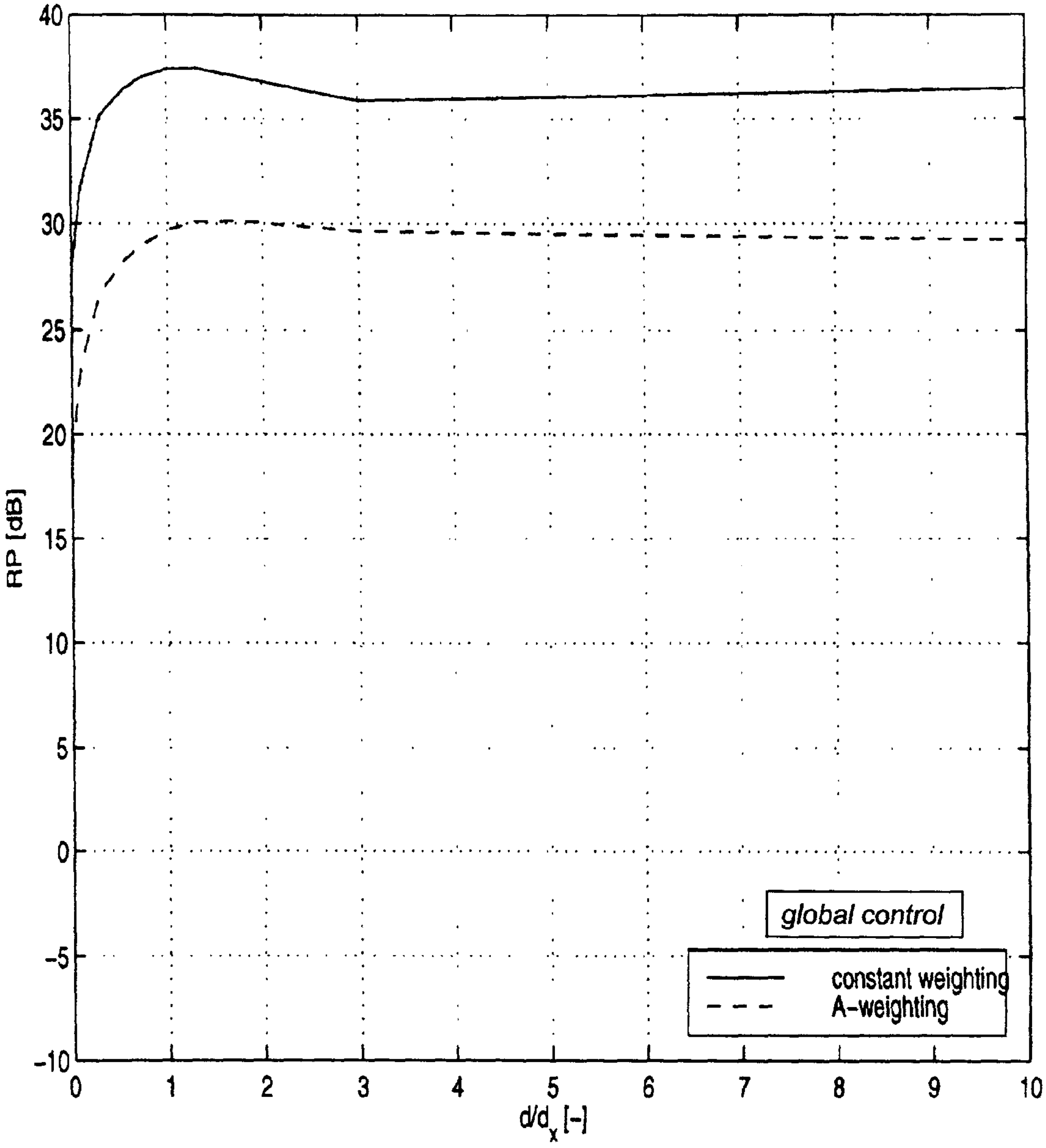
FIG. 9 shows broad band reduction of sound power according to FIG. 8, taking into account all frequencies $f<c/2d_x$.

The results for a global control system are shown in FIGS. 8 and 9. The differences with the preceding local control systems are mainly in the high-frequency range. This leads to larger optimum values for d as well as less pronounced maxima.

Comparing FIGS. 5, 7 and 9 with one another shows that in local control systems (FIGS. 5 and 7) the reduction of power RP of the total amount of noise relative to the primary noise within a predetermined frequency band shows a peak value between $½ \leqq d/d_x \leqq 1$ whereas in global control systems (FIG. 9) no substantial peak value is present: then, the requirement seems to be $½ \leqq d/d_x$. Moreover, it follows that the maximum obtainable reduction in all three cases (FIGS. 5, 7, and 9) is similar. Thus, when using local control instead of global control a similar value of reduction is possible provided the distance between the plane of actuators 3(*n*) and the plane of sensors 2(*m*) is selected carefully, i.e., in the area of the peak value of RP, preferably such that:

$$0.9 \times RP_{max} \leqq RP \leqq RP_{max}$$

Performance in Reverberating Environment

Figure 10:
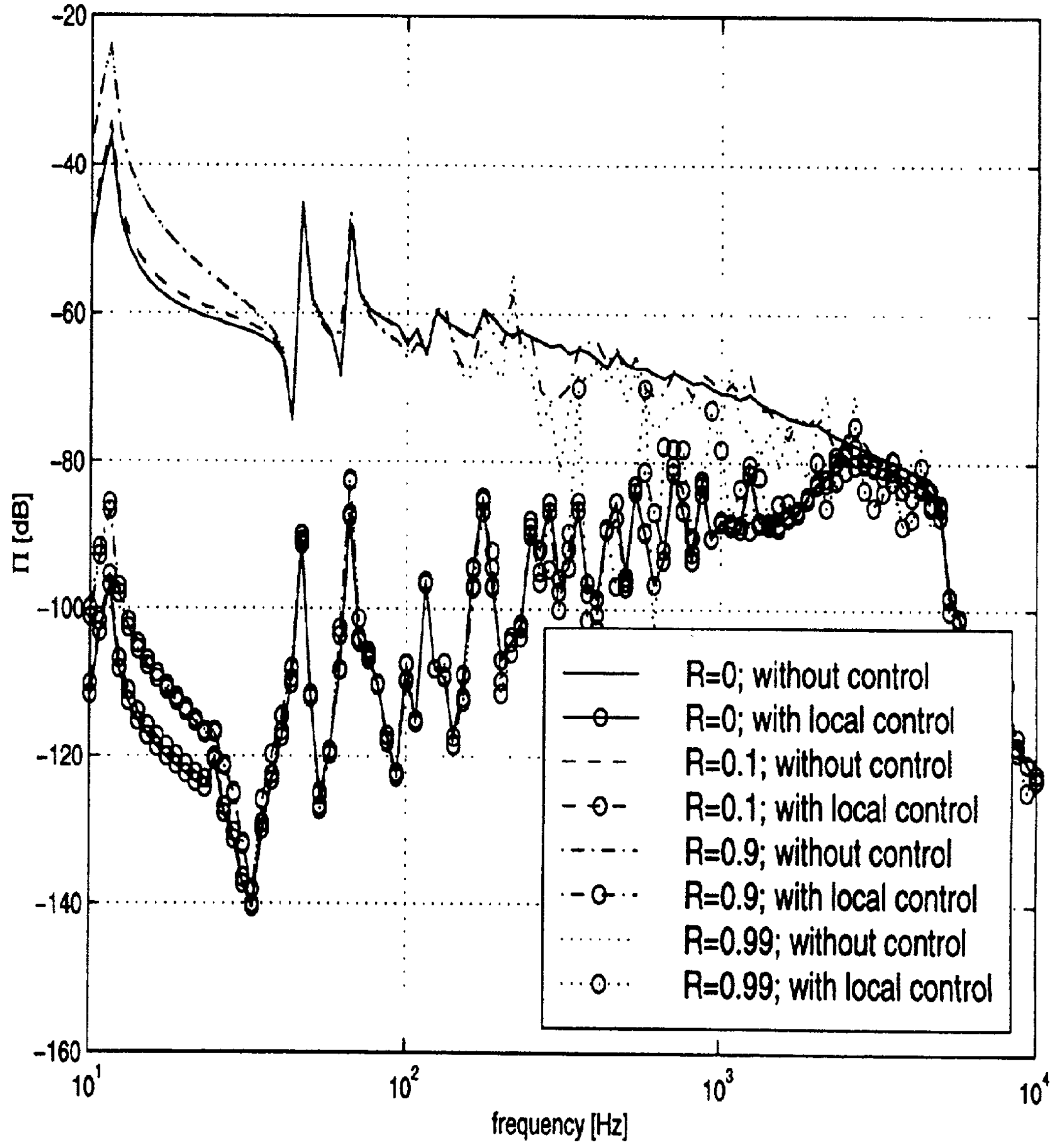
FIG. 10 shows sound power curves as a function of frequency for an arrangement in which the sound produced is reflected by a further plate parallel to the plate supporting the actuators, the reflection coefficient R being a parameter.
Figure 11:
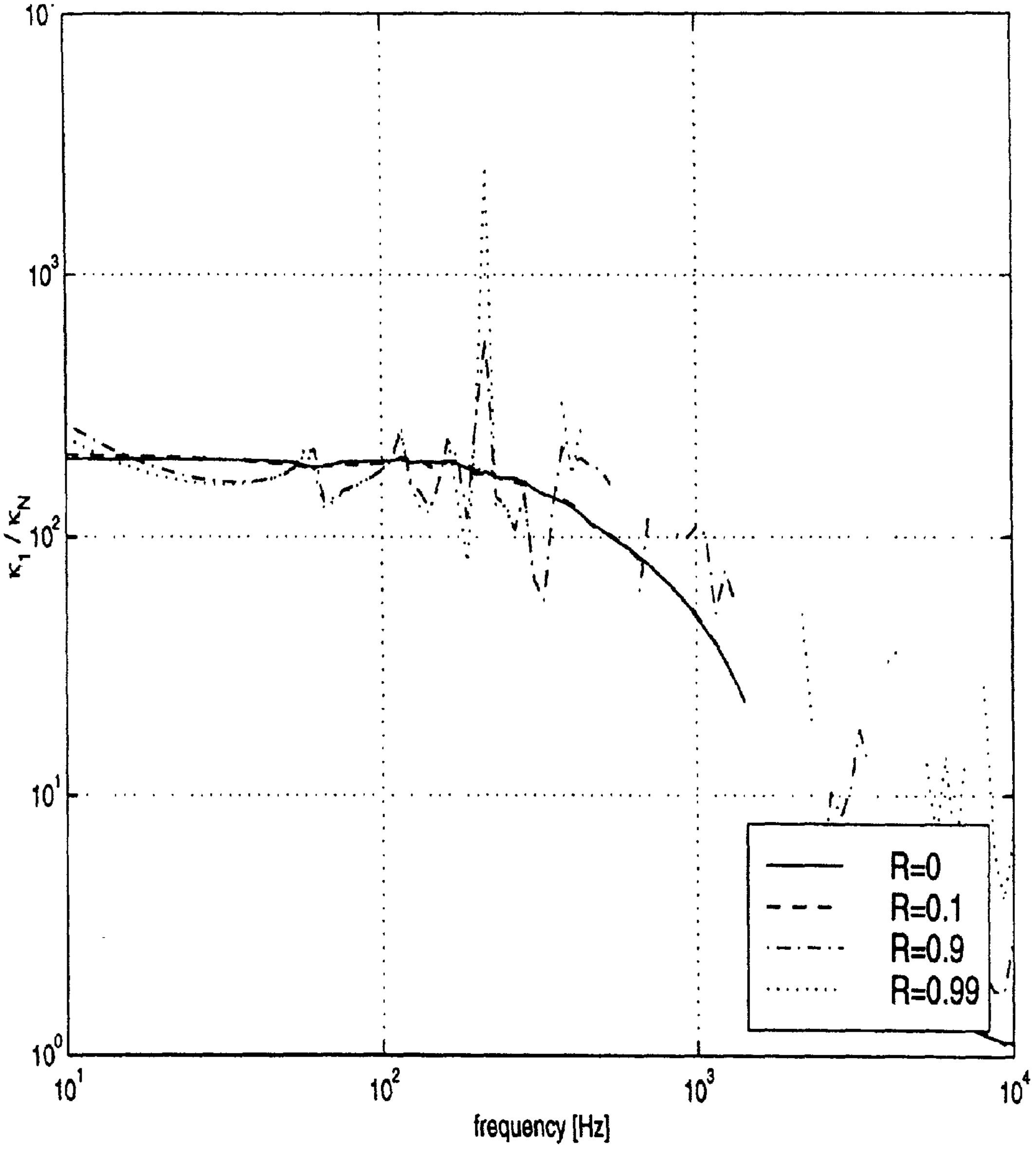
FIG. 11 shows condition numbers for some of the curves shown in FIG. 8.

The performance of the local control system was also investigated for the case including reflecting parallel plane 8. The distance of this plane 8 to the actuators was taken to be 1 m. The reduction which can be obtained with this configuration is shown in FIG. 10 and the corresponding condition numbers in FIG. 11. It can be seen that for reflection coefficients smaller than or equal to 0.9 the control system remains stable and leads to reasonable reductions. For a reflection coefficient of 0.99 the possible reduction above approximately 500 Hz becomes less than for lower reflection coefficients.

| List of symbols | |
|---|---|
| G = | M × N matrix of transfer functions between control signals u and sensor signals p |
| $G_i$ = | M × K matrix of transfer functions between control signals $u_i$ and sensor signals p. |
| $J_i$ = | scalar cost function of controller 5(i); i = 1, 2, . . . , I |
| $p_p$ = | primary field contributions |
| p = | M × 1 vector denoting the sensor signals p(1), p(2), . . . , p(m), . . . , p(M) |
| u = | N × 1 vector denoting the control signals u(1), u(2), . . . , u(n), . . . , u(N), that drive the actuators 3(n) |
| $u_i$ = | K × 1 vector denoting the control signals $u_i(1)$, $u_1(2)$, . . . , $u_i(k)$, . . . , $u_i(K)$ for node i |

-continued

| List of symbols | |
|---|---|
| $W_i$ = | weighting matrix of dimensions P × M |
| $\beta_i$ = | K × K dimensional effort weighting matrix |
| $K_N$ = | smallest singular value of Hessian matrix $\hat{G}^H G + \beta$ |
| $K_1$ = | largest singular value of Hessian matrix $\hat{G}^H G + \beta$ |

LITERATURE

[1] S. J. Elliott and C. C. Boucher, "Interaction between multiple feedforward active control systems," IEEE Transactions on Speech and Audio Processing 2, pp. 521–530, October 1994.

[2] X. Qui, C. H. Hansen and X. Li, "A comparison of near-field acoustic error sensing strategies for the active control of harmonic free field sound radiation", J. Sound and Vibration 215, pp. 81–103, 1998.

[3] S. S. Haykin, "Adaptive Filter Theory," 2nd. edition, Prentice-Hall, Englewood Cliffs, 1991.

[4] P. A. Nelson and S. J. Elliott, "Active control of Sound," Academic Press, 1992.

[5] S. J. Elliott, C. C. Boucher and P. A. Nelson, "The behaviour of a multiple channel active control system," IEEE Transactions on Signal Processing 40, pp. 1041–1052, May 1992.

[6] The Mathworks Inc., Matlab 5 User's Guide, 1997.

[7] C. R. Fuller, S. J. Elliott and P. A. Nelson, "Active Control of Vibration," Academic Press, 1996.

[8] A. P. Berkhoff, J. M. Thijssen and R. J. F. Homan, "Simulation of ultrasonic imaging with linear arrays in causal absorptive media", Ultrasound Med Biol 21, 1996, pp. 245–259.

[9] A. P. Berkhoff, P. M. van den Berg, J. M. Thijssen, "Ultrasound wave propagation through rough interfaces: iterative methods", J. Acoustic Soc. Am., 1996, Vol. 99, pp. 1306–1314.

[10] E. G. Williams, J. D. Maynard, "Numerical evaluation of the Rayleigh integral for planar radiators using the FFT", J. Acoustic Soc. Am., Vol. 72, pp. 2020–2030, 1982.

What is claimed is:

1. Noise reduction arrangement comprising:

a plurality of actuators (3(*n*)) for generating secondary noise ($p_s$) to reduce primary noise ($p_p$) generated by at least one primary source (4);

a plurality of sensors (2(*m*)) for sensing a total amount of noise resulting from the primary noise after being reduced by the secondary noise and for generating a plurality of sensor signals (p(m));

control means (5*a*(i), 5*b*(i)) for controlling the actuators (3(*n*)) based on the sensor signals (p(m)), a distance (d) between the plurality of actuators (3(*n*)) and the plurality of sensors (2(*m*)) being selected to have an optimised reduction in power RP of the total amount of noise relative to the primary noise within a predetermined frequency band, characterised in that the plurality of actuators (3(*n*)) are located in a first two dimensional array in a first surface;

the plurality of sensors (2(*m*)) are located in a second two dimensional array in a second surface arranged substantially parallel to the first surface;

the plurality of actuators (3(*n*)) are sub-divided into a plurality of sub-sets of actuators (3(*n*));

the control means (5*a*(i), 5*b*(i)) comprise a plurality of controllers (5*a*(i), 5*b*(i)), each controller (5*a*(i), 5*b*(i)) being arranged to receive sensor signals of a sub-set of said plurality of sensors (2(*m*)) and arranged to control one single sub-set of actuators (3(*n*)); and said first and second surfaces are arranged at such a mutual distance that the reduction of power RP is within the following range:

$$0.9\times RP_{max} \leqq RP \leqq RP_{max}$$

in which $RP_{max}$ is maximum obtainable reduction in power of the total amount of noise relative to the primary noise at an optimum distance between said first and second surfaces as established by testing, where both RP and $RP_{max}$ are expressed in decibel, the plurality of actuators being arranged in rows and columns, mutual distances between adjacent columns and mutual distances between adjacent rows being equal to a predetermined actuator distance $d_x$, the plurality of sensors being arranged in the same way as the plurality of actuators, the distance d between the first and the second surfaces meeting the following condition:

$$0.5\times d_x \leqq d \leqq d_x.$$

2. Arrangement according to claim 1, wherein each controller (5*a*(i), 5*b*(i) is arranged to receive sensor signals of only those sensors (2(*m*)) which are within a predetermined range from said controller (5*a*(i), 5*b*(i)).

3. Arrangement according to claim 1, wherein the plurality of sensors (2(*m*)) equals the plurality of actuators (3(*n*)) and equals the plurality of controllers (5*a*(i), 5*b*(i)), each controller (5*a*(i), 5*b*(i)) receiving one of the plurality of sensor signals (p(m)) as input signal and controlling one of the plurality of actuators (3(*n*)).

4. Arrangement according to claim 1, wherein a sound reflective wall (8) is present such that the second surface is between the first surface and the wall (8).

5. Arrangement according to claim 1, wherein one or more detection sensors (7(*r*)) are arranged for sensing said primary source (4) and providing one or more detection sensor signals ($V_{det}$(i)) to said plurality of controllers (5*a*(i), 5*b*(i)).

6. Arrangement according to claim 1, wherein a supervising controller (6) is provided to receive signals in dependence on said sensor signals (p(m)) and to monitor long-term behaviour of the arrangement by modifying control parameters of the controllers (5*a*(i), 5*b*(i)) in order to ensure overall stability of the arrangement based on a predetermined error criterion as to the sensor signals (p(m)).

* * * * *